(12) United States Patent
Shimada

(10) Patent No.: US 6,255,701 B1
(45) Date of Patent: *Jul. 3, 2001

(54) SEMICONDUCTOR DEVICE CONTAINING LOCAL INTERCONNECTION AND METHOD OF MANUFACTURING THE SAME

(75) Inventor: Hiroyuki Shimada, Chino (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/070,235

(22) Filed: Apr. 30, 1998

Related U.S. Application Data

(63) Continuation of application No. PCT/JP96/03244, filed on Nov. 6, 1996.

(30) Foreign Application Priority Data

Nov. 6, 1995 (JP) .................................................. 7-287706

(51) Int. Cl.$^7$ ........................... H01L 29/76; H01L 29/94; H01L 31/062; H01L 31/113
(52) U.S. Cl. ......................... 257/384; 257/382; 257/412; 257/413
(58) Field of Search .................................. 257/382, 384, 257/412, 413, 751, 755

(56) References Cited

U.S. PATENT DOCUMENTS

| | | | | |
|---|---|---|---|---|
| 5,094,980 | * | 3/1992 | Shepela | 257/384 |
| 5,190,893 | * | 3/1993 | Jones, Jr. et al. | 437/192 |
| 5,444,018 | * | 8/1995 | Yost et al. | 437/190 |
| 5,654,575 | * | 8/1997 | Jeng | 257/384 |
| 5,936,306 | * | 8/1999 | Jeng | 257/384 |

FOREIGN PATENT DOCUMENTS

| | | | |
|---|---|---|---|
| 3234062 | 10/1991 | (JP) | 257/384 |
| 5136086 | 6/1993 | (JP) . | |
| 5160070 | 6/1993 | (JP) | 257/384 |

\* cited by examiner

Primary Examiner—Steven Loke
(74) Attorney, Agent, or Firm—Hogan & Hartson, LLP

(57) ABSTRACT

A semiconductor device has a local interconnecting part (20) for electrically connecting a silicon-containing first layer (12) and silicon-containing second layer (16). The local interconnecting part has a first metal silicide layer (22a) formed in a self-aligning manner on a surface of the first layer, a second metal silicide layer (22b) formed in a self-aligning manner on a surface of the second layer, and an interconnecting part for electrically connecting the first metal silicide layer and the second metal silicide layer. The interconnecting part has a single or a plurality of metallic layers (27), or a barrier layer (24) formed in contact with at least the first and second metal silicide layers, and a conductive layer (26) having a lower resistance than the barrier layer. In the semiconductor device, since impurities are hardly diffused in the metal or the barrier layer which constitutes the interconnecting part, the concentration of impurities in a layer with a defined silicon concentration, for example, in a source or drain region of a MOS element, does not vary, thus eliminating variation in the threshold value due to counter doping and increase in junction leak due to a decrease in impurity concentration. Since the interconnecting part has the conductive layer composed of a metal with high conductivity, the electrical resistance can be decreased, as compared with a conventional titanium nitride layer.

2 Claims, 11 Drawing Sheets

SEMICONDUCTOR DEVICE CONTAINING LOCAL INTERCONNECTION AND METHOD OF MANUFACTURING THE SAME

This application is a continuation of PCT Application No. PCT/JP96/03244 having an international filing date of Nov. 6, 1996, which claims priority from Japan Application No. 7-287706 filed Nov. 6, 1995.

BACKGROUND OF THE INVENTION

1. Field of the Invention

The present invention relates to a semiconductor device having local wiring (local interconnection) formed by a salicide technology and a method of manufacturing the same.

2. Description of Related Art

For example, miniaturization of a MOS transistor causes a delay due to an increase in resistance of an impurity diffused layer, which constitutes a source region or a drain region (source/drain region) of the transistor, relative to a channel resistance. As means for solving this problem, a MOS transistor which uses the salicide technology has been developed.

A salicide MOS transistor is a transistor in which, in order to decrease the resistance, a metal silicide is formed in a self-aligning manner on the surfaces of a polysilicon layer which constitutes a gate electrode, and an impurity diffused layer which constitutes a source/drain region.

For the salicide MOS transistor, the technology of forming a local interconnection simultaneously with the formation of the metal silicide layer is known. Examples of such technologies include a method in which a film of a high-melting-point metal nitride formed simultaneously with the formation of a high-melting-point metal silicide layer is used as a local interconnection, a method in which a high-melting-point metal layer which can form a silicide is deposited, and an amorphous silicon layer is then formed, followed by heat treatment to form a silicide layer.

FIGS. 17 to 20 are sectional views schematically showing in turn the steps of the latter method. In this method, as shown in FIG. 17, a titanium layer 210 is first formed on a silicon substrate 10 having MOSFET 100 formed thereon, as in a usual salicide process. The titanium layer 210 is formed over the entire region including source/drain regions 12a and 12b, a gate electrode 16 and a side wall insulating layer 18, which constitute the MOSFET 100. As shown in FIG. 18, an amorphous silicon layer is then formed on the surface of the titanium layer 210, followed by usual photolithography and dry etching to form an amorphous silicon layer 80 patterned in the predetermined plane form of a local interconnection. As shown in FIG. 19, heat treatment is performed for forming a silicide, and unreacted portions of the amorphous silicon layer and the titanium layer are removed by wet etching. In this step, titanium silicide layers 22a and 22b are formed on the source/drain regions 12a and 12b, and the gate electrode 16, and a local interconnecting layer 22c for connecting one of the source/drain regions 12b and the gate electrode 16 is formed. As shown in FIG. 20, an interlayer insulating film 30 is formed, a contact hole 30a is formed at a predetermined position, and a metallic interconnecting layer 32 is formed.

In the above-mentioned conventional method, since the local interconnecting layer 22c comprises a metal silicide (titanium silicide) in which impurities are easily diffused, the impurity concentration of the source/drain region 12b easily changes by the diffusion of impurities. Namely, this method has the problem of causing variations in the threshold value due to the diffusion the impurities to the source/drain region 12b through the local interconnecting layer 22c, and the problem of easily increasing a contact resistance and a junction leak due to a decrease in the impurity concentration.

The technology of forming a local interconnection by using a titanium nitride film, as disclosed in U.S. Pat. No. 4,746,219 causes no diffusion of impurities through the local interconnection, but has the problem of having the high electric resistance of the local interconnection.

SUMMARY OF THE INVENTION

An object of the present invention is to provide a semiconductor device and a method of manufacturing the same which can prevent impurity diffusion and which has a low-resistance local interconnection.

A semiconductor device of the present invention comprises a local interconnecting part for electrically connecting a silicon-containing first layer and a silicon-containing second layer, wherein the local interconnecting part comprises a first metal silicide layer formed in a self-aligning manner on the surface of the first layer, a second metal silicide layer formed in a self-aligning manner on the surface of the second layer, and an interconnecting part for electrically connecting the first metal silicide layer and the second metal silicide layer, the interconnecting part comprising a single metallic layer or a plurality of metallic layers as a component. Alternatively, the interconnecting part comprises a barrier layer formed in contact with at least the first and second metal silicide layers, and a conductive layer having a lower resistance than the barrier layer.

In the present invention, since the local interconnecting part for electrically connecting the first metal silicide and the second metal silicide has the interconnecting part comprising the metallic layer or the barrier layer and the conductive layer, the present invention has the following functions:

a. Since n-type and p-type impurities hardly diffuse in the metallic layer or the barrier layer which constitutes the interconnecting part, the impurity concentration of a layer having a defined silicon concentration, for example, a source or drain region of a MOS transistor, is not changed, thereby causing neither variation in the threshold value due to counter doping nor increase in contact resistance and junction leak due to a decrease in impurity concentration.

b. Since the interconnecting part comprises the conductive layer composed of a metal or the like, the electric resistance can be decreased, as compared with a conventional titanium nitride layer.

In addition, the use of local interconnection for a connecting structure makes unnecessary an interconnecting layer through a contact hole, and thus permits an attempt to increase the degree of integration of a pattern layout.

Examples of a semiconductor device comprising combination of the silicon-containing first layer and second layer which are connected by the local interconnecting part include the following:

A. A semiconductor device in which the first and second layer are formed in a region of the same element and contain the same type of impurity, the first layer comprises an impurity-diffused layer formed on a main surface of a semiconductor substrate, and the second layer comprises an interconnecting layer formed on the semiconductor substrate through at least an insulating layer and containing the same type impurity as the impurity-diffused layer.

A typical example of such a semiconductor device is a MOS element. The first layer comprises an impurity-diffused layer which constitutes a source or drain region, and the second layer comprises a gate electrode.

B. A semiconductor device in which the first layer is a first conduction type impurity-diffused layer formed in a region of a first element on a main surface of a semiconductor substrate, and the second layer is a second conduction type impurity-diffused layer formed in a region of a second element on a main surface of the semiconductor substrate.

A typical example of such a semiconductor device is a CMOS element. The first layer is an n-type impurity-diffused layer which constitutes a source or drain region of a NMOS element, and the second layer is a p-type impurity-diffused layer which constitutes a source or drain region of a PMOS element.

C. A semiconductor device in which the first layer is an interconnecting layer formed in a region of a first element on a main surface of a semiconductor substrate at least through an insulating layer and containing a first conduction type impurity, and the second layer is an interconnecting layer formed in a region of a second element on a main surface of the semiconductor substrate at least through an insulating layer and containing a second conduction type impurity.

A typical example of such a semiconductor device is a CMOS element. The first layer comprises an n$^+$ type gate electrode of a NMOS element, and the second layer comprises a p$^+$ type gate electrode of a PMOS element.

D. A semiconductor device in which the first and second layers are formed in a region of the same element and contains the same type impurity, the first layer is an impurity-diffused layer formed on a main surface of a semiconductor substrate, and the second layer is an impurity-diffused layer formed at a distance from the first layer on the semiconductor substrate.

A typical example of such a semiconductor device is a device containing a MOS element. The first layer is an impurity-diffused layer which constitutes a source or drain region, and the second layer is an impurity-diffused contact layer formed at a distance from the impurity-diffused layer which constitutes the source or drain region.

In one embodiment, the semiconductor device of the present invention may comprise a gate electrode having a metal silicide layer as an uppermost layer provided above the silicon substrate through an insulating film, a side wall insulating layer provided on the side wall of the gate electrode, impurity-diffused layers provided in the silicon substrate so as to hold the gate electrode therebetween and serve as a source or drain region and having a metal silicide layer formed in at least a portion of the surface thereof, and a local interconnecting part comprising a metallic layer as a component and extending over the gate electrode, the side wall insulting layer and the impurity-diffused layers so as to electrically connect the gate electrode and the impurity-diffused layers, an interlayer insulating film provided on the local interconnecting part, a contact hole formed in the interlayer insulating film so as to communicate with the local interconnecting part, and a metallic layer provided on and in the contact hole.

A portion of the local interconnecting part which is formed under the contact hole can be used as self-aligning contact, and a margin for superposing a photomask can thus be increased.

The local interconnecting part of the present invention can be used for not only the semiconductor device comprising a MOS element or CMOS element but also any device to which local interconnection can be applied. For example, the local interconnecting part can be applied to logic elements such as SRAM, FPGA and the like, and other devices which are required to operate at a high speed with increases in the scale and integration of semiconductor integrated circuits.

The metallic layer which constitutes the interconnecting part preferably comprises at least one selected from the group consisting of tungsten, molybdenum, tantalum and platinum.

The barrier layer preferably comprises a nitride of at least one metal selected from the group consisting of titanium, tungsten, cobalt and nickel.

The conductive layer preferably comprises at least one selected from the group consisting of tungsten, molybdenum, tantalum and platinum, or a silicide thereof.

A method of manufacturing the semiconductor device of the present invention at least comprises the steps of forming a first metallic layer which can form a silicide, on the surfaces of silicon-containing first and second layers; forming, on the first metallic layer, a second metal layer for forming a local interconnecting part, or a barrier layer and a conductive layer having lower resistance than the barrier layer; silicidizing the first metal layer; and patterning the second metallic layer or the barrier layer and the conductive layer to form the local interconnecting part.

DETAILED DESCRIPTION OF EMBODIMENTS

Embodiments of the present invention will be described in detail below with reference to the accompanying drawings.

Figure 4:
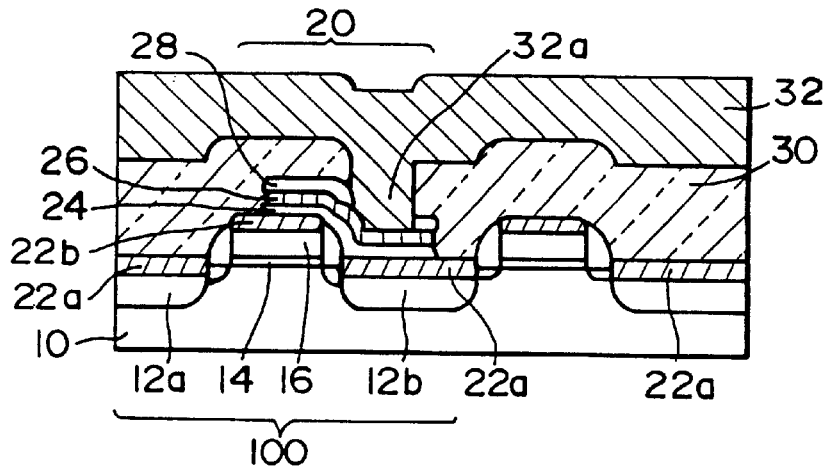
FIG. 4 is a sectional view schematically showing the semiconductor device in accordance with the first embodiment of the present invention.

FIG. 4 is a sectional view schematically showing a semiconductor device in accordance with a first embodiment of the present invention.

The semiconductor device comprises a MOSFET 100 having an extension region, and a local interconnecting part 20. The MOSFET 100 comprises a gate insulating layer 14 formed on a silicon substrate 10, a gate electrode 16, side wall insulating films 18 formed on both sides of the gate electrode 16, and impurity-diffused layers 12a and 12b formed on the surface of the silicon substrate 10 and constituting a source/drain region.

Metal silicide layers 22a and 22b comprising titanium, cobalt, nickel, or the like are formed on the surfaces of the impurity-diffused layers 12a and 12b, and the gate electrode 16.

The local interconnecting part 20 electrically connects one 12b of the impurity-diffused layers and the gate electrode 16. The local interconnecting part 20 has an interconnecting part comprising the metal silicide layers 22a and 22b formed on the surfaces of the impurity-diffused layer 12b and the gate electrode 16, respectively, a barrier layer 24 and a conductive layer 26 having a lower resistance than that of the barrier layer 24.

The barrier layer 24 preferably comprises a nitride of a metal selected from metals in which p- or n-type impurities hardly diffuse, and which can sufficiently prevent changes in the impurities of the impurity-diffused layer 12b, such as titanium, tungsten, cobalt and nickel.

The conductive layer 26 preferably comprises a metal which has a lower electric resistance than that of the barrier layer 24 and which can resist high-temperature heat treatment, for example, high-melting-point metals such as tungsten, molybdenum and the like, or a silicide thereof.

An interlayer insulating film 30 is formed on the surfaces of the MOSFET 100 and the local interconnecting part 20, and an interconnecting layer 32 is formed to be connected to the local interconnecting part 20 through a contact part 32a. Although, as shown in FIG. 4, the contact part 32a is provided above the impurity-diffused layer 12b, the contact part may be provided above the side wall insulating layer 18 or the gate electrode 16. Therefore, the precision of registration of the contact part 32a need not be taken into strict consideration, thereby causing suitability for miniaturization of a device.

In the above semiconductor device, since the local interconnecting part 20 has the barrier layer 24 in which impurities are hardly diffused, substantially no n- or p-type impurity diffuses through the local interconnecting part 20. There is thus no possibility that the impurity concentration in the impurity-diffused layer 12b changes, thereby causing neither variation in the threshold value nor increase in junction leak and contact resistance. Further, since the local interconnecting part 20 has the conductive layer 26 having higher conductivity than the barrier layer 24, low-resistance local interconnection can be realized.

A method of manufacturing the semiconductor device having the above local interconnecting part 20 will be described below.

Figure 1:
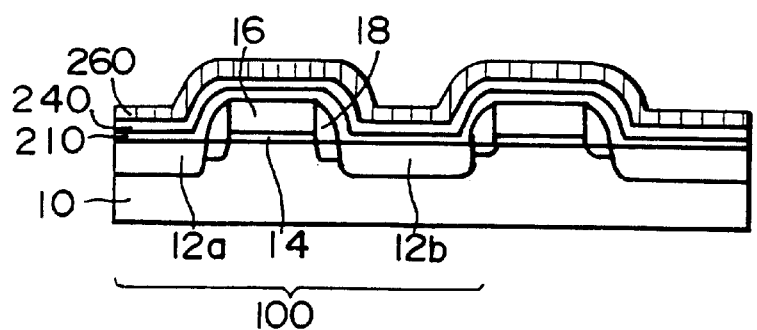
FIGS. 1 to 3 are sectional views schematically showing in turn the steps of a method of manufacturing a semiconductor device in accordance with a first embodiment of the present invention.

(a) As shown in FIG. 1, the gate insulating layer 14 and the gate electrode 16 doped with impurities and comprising polysilicon are formed on the silicon substrate 10, and the impurity-diffused layers 12a and 12b which constitute the source/drain region are formed in the silicon substrate 10, to form the MOS element 100. The method of manufacturing the MOS element 100 is not limited to this embodiment, and the MOS element 100 can be formed by a general method.

The metallic layer 210 having a thickness of, for example, 5 nm to 100 nm, is then formed on the surface of the substrate on which the MOS element 100 is formed. The metallic layer 210 preferably comprises a metal which can form a silicide, for example, a metal selected from titanium, cobalt and nickel. On the surface of the metallic layer 210, the barrier layer 240 is formed to a thickness of 5 to 100 nm. The barrier layer 240 comprises a nitride of a metal which constitutes the metallic layer 210, e.g., a nitride selected from titanium nitride, cobalt nitride and nickel nitride. On the surface of the barrier layer 240, the conductive layer 260 is formed to a thickness of about 50 to 300 nm. The conductive layer 260 comprises a high-melting-point metal such as tantalum or molybdenum. The metallic layer 210, the barrier layer 240 and the conductive layer 260 are continuously formed by, for example, a sputtering process.

Figure 2:
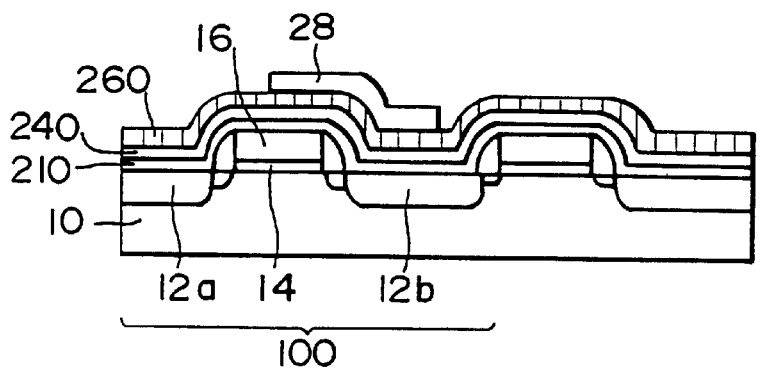

(b) As shown in FIG. 2, a cap layer 28 is formed. In the formation of the cap layer 28, an oxide film having a thickness of 30 to 200 nm is first deposited by a plasma CVD process using tetraethoxy silane (TEOS), and then patterned by ordinary lithography and dry etching to form the cap layer 28. The cap layer 28 functions as a mask for the local interconnecting part to be formed in the next step.

(c) Heat treatment is then performed for silicidization to form the metal silicide layers 22a and 22b in the contact part between the impurity-diffused layers 12a and 12b and the metallic layer 210, and in the contact part between the gate electrode 16 comprising polysilicon and the metallic layer 210. The heat treatment for silicidization is performed, for example, at room temperature to 85° C. for about 30 to 200 seconds.

Figure 3:
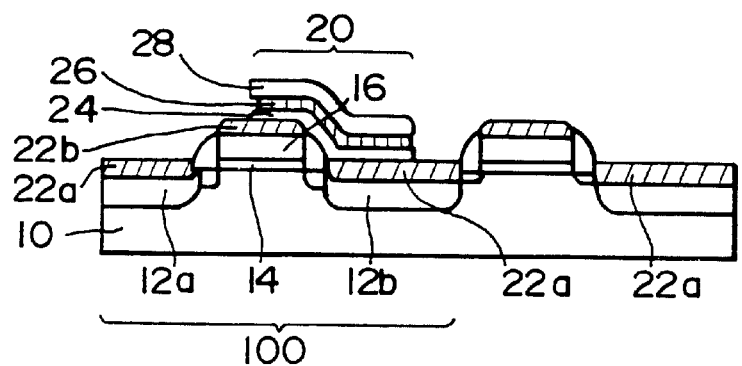

Unreacted portions of the films are then removed by etching with an etchant containing ammonia-hydrogen peroxide as a main component in a self-aligning manner. As a result, as shown in FIG. 3, the conductive layer 26 and the barrier layer 24 below the cap layer 28 are left to form the interconnecting part of the local interconnecting part 20 comprising the two layers. Besides the above etchant, etchants containing hydrogen peroxide and sulfuric acid or hydrochloric acid can also be applied in accordance with the quality of the unreacted metal.

In order to stabilize the metal silicide layers 22a and 22b, heat treatment is further performed. The heat treatment is performed, for example, at 400 to 1000° C. for about 10 to 60 seconds.

(d) The interlayer insulating film 30 having a thickness of 30 to 200 nm is then formed by the CVD method using, for example, tetraethoxysilane. The contact hole 32 is formed at a predetermined position of the interlayer insulating film 30, (e.g., in this embodiment, at a position communicating with the local interconnecting part 20), and the metal interconnecting layer 32 comprising aluminum as a main component is then formed.

The semiconductor device of this embodiment shown in FIG. 4 can be formed through the above-mentioned steps (a) to (d).

Although, in the above manufacturing method, the local interconnecting part 20 is patterned by simultaneously wet-etching the barrier layer 240 and the conductive layer 260 by using the $SiO_2$ cap layer 28 formed as a mask, patterning is not limited to this. For example, in order to increase the positional precision of the local interconnecting part, the conductive layer 260 may be formed by dry etching, and then the barrier layer 240 may be formed by wet etching.

Figure 5:
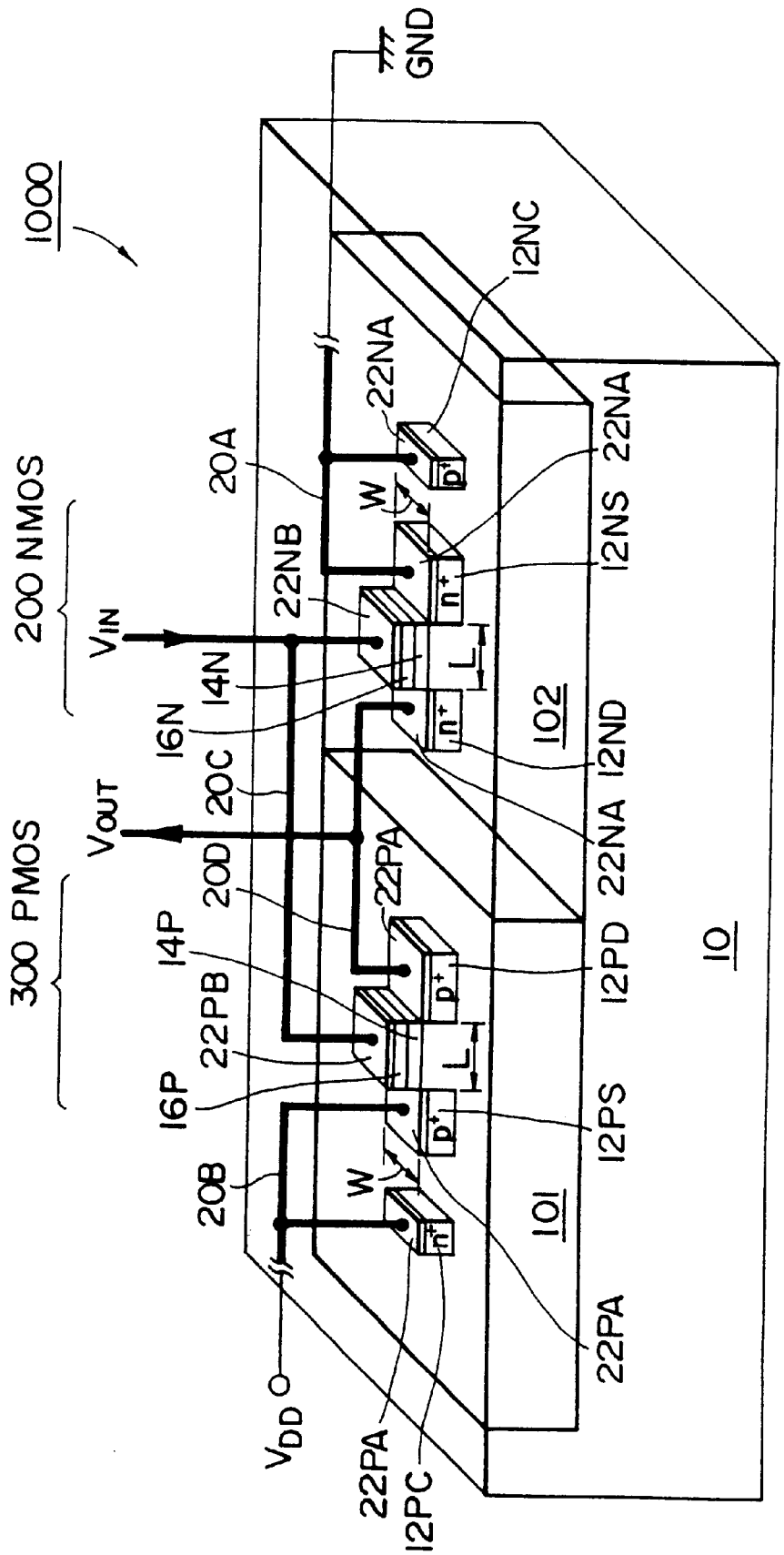
FIG. 5 is a see-through perspective view schematically showing a CMOS inverter in accordance with a second embodiment of the present invention.

FIG. 5 is a perspective view illustrating a CMOS inverter 1000 in a see-through state in accordance with a second embodiment of the present invention.

The CMOS inverter 1000 comprises a PMOS 300 formed in an n-type well 101 and an NMOS 200 formed in a p-type well 102, both of which are formed in a p-type silicon substrate 10.

The NMOS 200 is first described. A gate insulating layer 14N is formed on the surface of the p-type well 102, and a gate electrode 16N comprising n$^+$-type polysilicon is deposited on the gate insulating layer 14N. In the p-type well 102, an n$^+$-type source region 12NS and an n$^+$-type drain region 12ND are formed on both sides of the gate electrode 16N. In the p-type well 102, a p$^+$-type impurity-diffused contact layer (referred to as a "contact layer" hereinafter) 12NC is formed at a distance from the source region 12NS. A metal silicide layer 22NA is formed on the surfaces of the source regions 12NS, the drain region 12ND and the contact layer 12NC by the salicide technology. A metal silicide layer 22NB is also formed on the surface of the gate electrode 16N by the same method as described above.

On the other hand, the PMOS 300 formed in the n-type well 101 basically has the same structure as the NMOS 200 except that the PMOS 300 contains impurities with polarity different from that of the NMOS 200. Namely, a gate insulating layer 14P and a gate electrode 16P comprising p$^+$-type polysilicon are formed on the n-type well 101, and a p$^+$-type source region 12PS, a p$^+$-type drain region 12PD and a n$^+$-type impurity-diffused contact region (contact layer) 12PC are formed in the n-type well 102. A metal silicide layer 22PA is formed on the surfaces of the source region 12PS, the drain region 12PD and the contact layer 12PC by the salicide technology, and a metal silicide layer 22PB is formed on the surface of the gate electrode 16P by the same method as described above.

Figure 6:
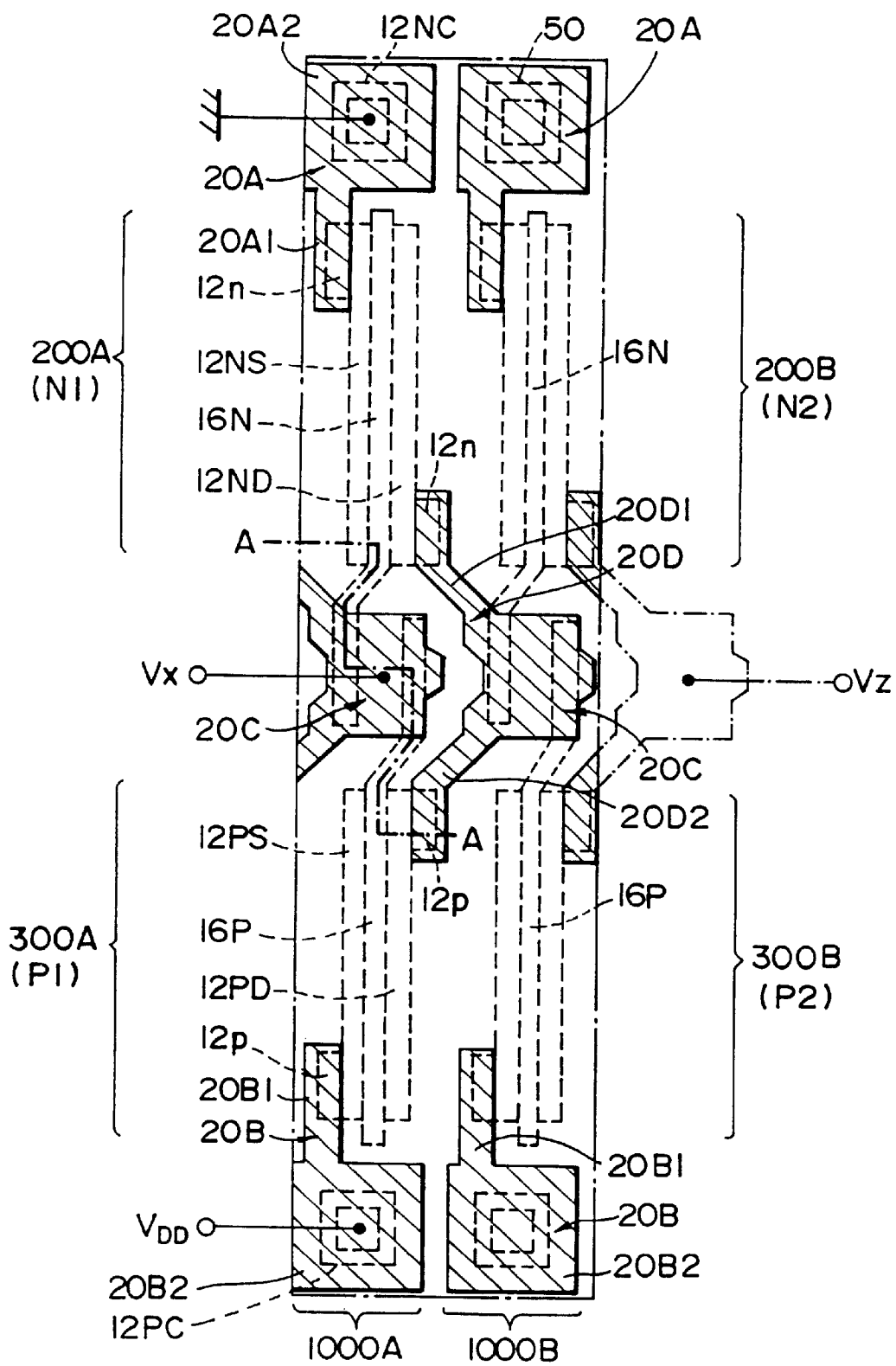
FIG. 6 is a plan view showing the layout of a ring oscillator cell comprising the CMOS inverters shown in FIG. 5 which are connected in series.
Figure 7:
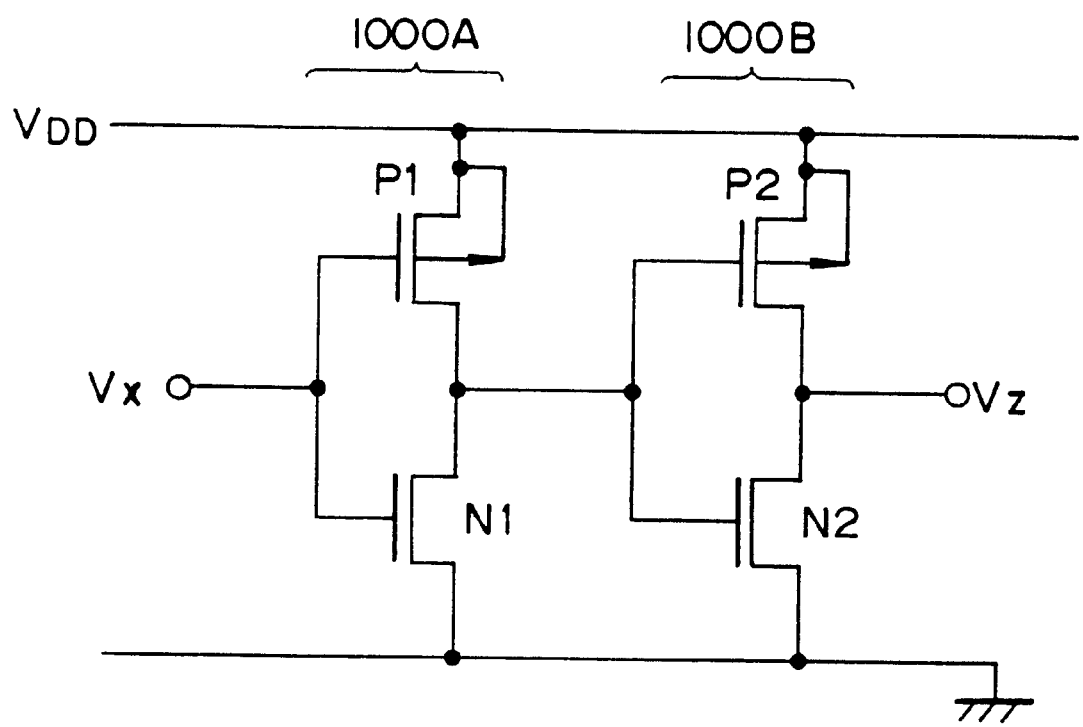
FIG. 7 is a view showing equivalent circuits of the ring oscillator cell shown in FIG. 6.

This embodiment is characterized in that the electrical connection of the CMOS inverter 1000 comprises the local interconnecting part. FIG. 6 is a plan view showing the layout of a ring oscillator cell comprising the two CMOS inverters 1000 shown in FIG. 5, which are connected in series. The interconnection region shown by thick lines in FIG. 5, and the shadowed portions shown in FIG. 6 comprise the local interconnecting part. FIG. 7 shows equivalent circuits of the ring oscillator cell shown in FIG. 6.

As shown in FIG. 6, local interconnecting parts comprise a local interconnecting part 20A for connecting the source region 12NS of the NMOS 200 (200A, 200B) and the contact layer 12NC, a local interconnecting part 20B for connecting the source region 12PS of PMOS 300 (300A, 300B) and the contact layer 12PC, a local interconnecting part 20C for connecting the gate electrode 16N of the NMOS 200 and the gate electrode 16P of the PMOS 300, and a local interconnecting part 20D for connecting the drain region 12ND of the NMOS 200 and the drain region 12PD of the PMOS 300.

In the ring oscillator cell shown in FIG. 6 to which the CMOS inverter of this embodiment is applied, as shown in FIG. 7, the output terminal of the first CMOS inverter 1000A is connected to the input terminal of the second CMOS inverter 1000B, each of the PMOS 300A and 300B (P1 and P2) is connected to a power source VDD, and each of NMOS 200A and 200B (N1 and N2) is grounded.

In the example of application shown in FIG. 6, regions for connecting to the local interconnecting parts 20A, 20B, 20C and 20D are formed in each of the CMOS inverters 1000A and 1000B. Namely, connecting regions 12n and 12p are formed at the ends of the source regions 12NS and 12PS, respectively, so that a portion of the impurity-diffused region is projected outward in a plan view.

Similarly, connecting parts 12n and 12p are formed at the ends of the drain regions 12ND and 12PD, respectively, so that a portion of the impurity-diffused region is projected in a plan view. The gate electrodes 16N and 16P are formed so that the ends thereof are bent opposite to each other with a space therebetween.

The local interconnecting part 20A for connecting the source region 12NS of the NMOS 200A (200B) and the contact layer 12NC which constitutes the CMOS inverter 1000A (1000B) has a first line part 20A1 connected to the connecting region 12n of the source region 12NS and a second rectangular part 20A2 formed on the contact layer 12NC and having a size sufficient for allowing connection with the metal interconnecting layer through the contact hole, i.e., having a margin for matching the mask during the formation of the contact hole, which is larger than the precision of registration in either the X direction or the Y direction. The second part 20A2 functions as a self-aligning contact part in a wide sense, and the formation of such a self-aligning contact part can ensure sufficient margins for design rules of the contact hole and for superposition. Similarly, the local interconnecting part 20B for connecting the connecting region 12P of the source region 12PS of the PMOS 300A (300B) and the contact layer 12PC has a first line part 20B1 and a second rectangular part 20B2, as in the local interconnecting part 20A.

The local interconnecting part 20C has a substantially rectangular part for connecting the gate electrode 16N of the NMOS 200A (200B) and the gate electrode 16P of the PMOS 300A (300B). The local interconnecting part 20D has a pair of line parts 20D1 and 20D2 for connecting the n-type drain region 12ND and the p-type drain region 12PD of the first CMOS inverter 1000A and the respective gate electrodes 16N and 16P of the second CMOS inverter 1000B. In this embodiment, the local interconnecting parts 20C and 20D are integrally formed.

Figure 12:
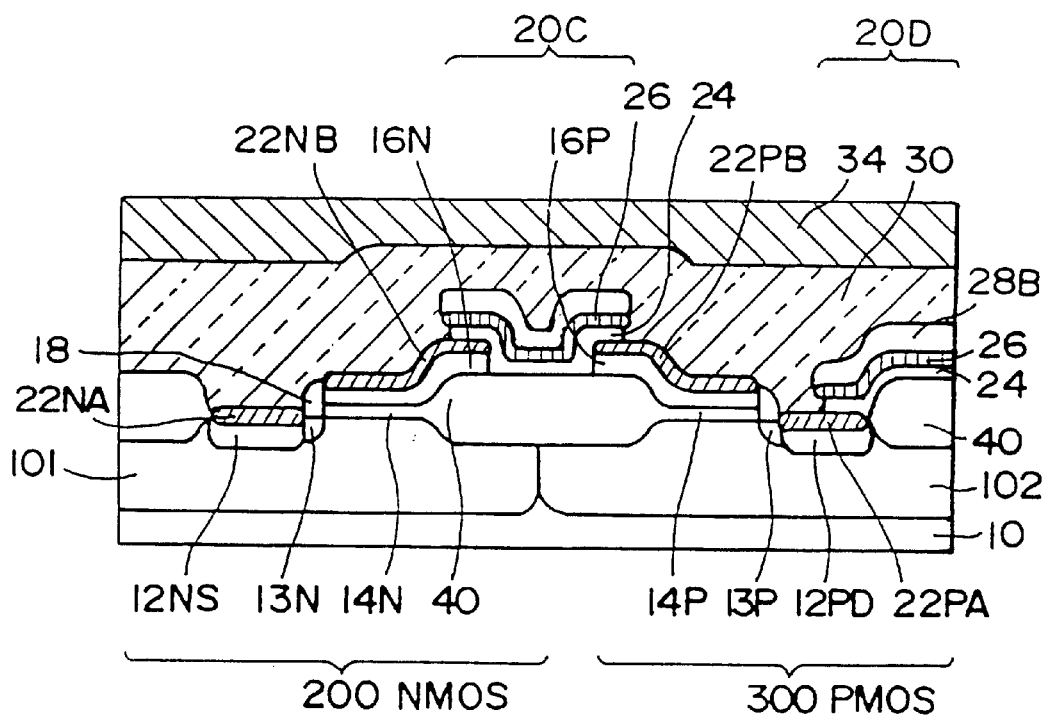
FIG. 12 is a sectional view taken along line A—A in FIG. 6.

FIG. 12 is a schematic sectional view of the ring oscillator cell taken along line A—A in FIG. 6. In FIG. 12, parts having the same functions as the members shown in FIGS. 5 and 6 are denoted by the same reference numerals, and are not described in detail below. FIG. 12 shows the interlayer insulating film 30 and the metallic interconnecting layer 34 which are not shown in FIG. 6.

As seen from FIG. 12, the gate electrode 16N of the NMOS 200 and the gate electrode 16P of the PMOS 300 are formed so that the ends thereof are extended on a field oxide film 40 (LOCOS) and at a predetermined distance therebetween. The gate electrode 16N and the gate electrode 16P are electrically connected by the local interconnecting part 20C.

In the connection structure comprising the local interconnecting part 20C, since the local interconnecting part 20C has a two-layer structure comprising the barrier layer 24 in which impurities are hardly diffused, and the low-resistance conductive layer 26, no impurity is diffused in the gate electrode 16N containing N-type impurities and the gate electrode 16P containing p-type impurities, thereby causing neither counter doping nor decrease in impurity concentration of the impurity-diffused layers which constitute the source/drain regions 12NS and 12PS. As a result, the threshold value is not changed, and a junction leak is not increased, thereby enabling connection with a lower resistance. In this embodiment, the same MOS manufacturing process and the same material for the interconnecting part of the local interconnecting part as the first embodiment can be used.

Description will be now made of an example of the method of manufacturing the ring oscillator cell shown in FIG. 6.

Figure 8:
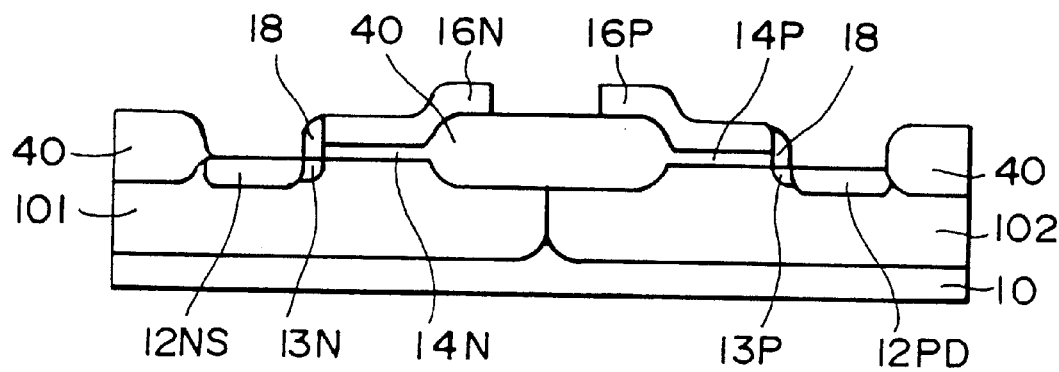
FIGS. 8 to 11 are sectional views schematically showing in turn the steps of an example of the method of manufacturing the ring oscillator cell shown in FIG. 6.

(a) A plurality of CMOS inverters 1000 are formed by a general method. For example, as shown in FIGS. 5 and 8, the p-type silicon substrate 10 is doped with phosphorus or the like to form the n-type well 101, and doped with boron or the like by a known method to form the p-type well 102 adjacent to the n-type well. On the silicon substrate 10 is formed the field oxide film 40. An insulating layer is further formed by a thermal oxidation process, and a polysilicon layer doped with n- or p-type impurities is further formed on the insulating layer by the CVD and ion implantation processes. The insulating film and the polysilicon layer are patterned to form the gate insulating layers 14N and 14P, the gate electrode 16N containing n-type impurities, and the gate electrode 16P containing p-type impurities.

In order to form the extension regions 13N and 13P, a diffusion region is formed by doping with phosphorus or boron by ion implantation. A silicon oxide film is further deposited by the CVD process to form the side wall insulating film 18 on both sides of the gate electrodes 16N and 16P. Impurities of arsenic and boron are then injected into the silicon substrate using each of the gate electrodes 16N and 16P and the field oxide film 40 as a mask, to form the n-type source/drain regions 12NS and 12ND and the p-type source/drain regions 12PD and 12PS, respectively.

Figure 9:
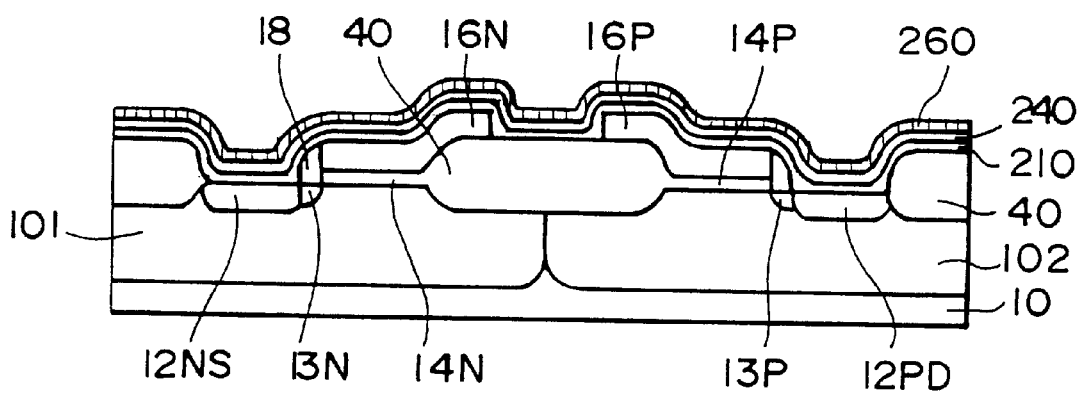

(b) Next, as shown in FIG. 9, a titanium layer 210, a titanium nitride layer 240 and a tungsten layer 260 are continuously formed over the entire surface of the silicon substrate 10 by the sputtering method. The thicknesses of the titanium layer 210, the titanium nitride layer and the tungsten layer are 5 to 100 nm, 5 to 100 nm and 50 to 300 nm, respectively.

Figure 10:
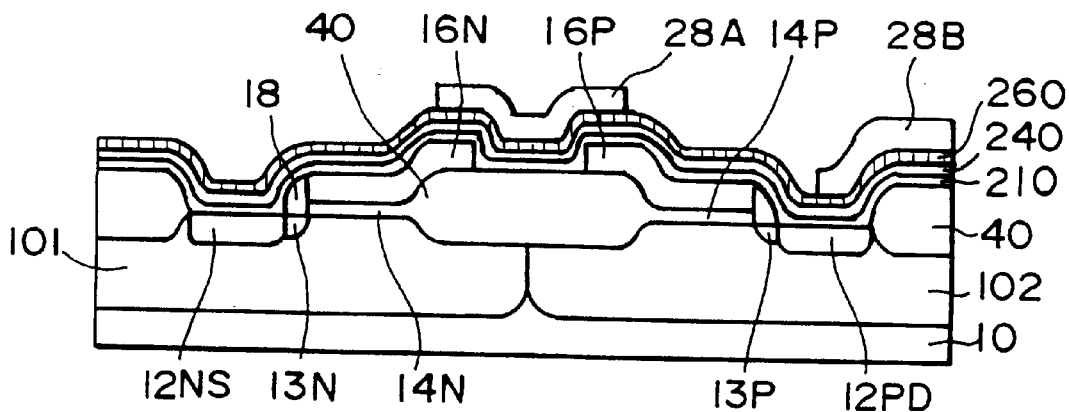

(c) As shown in FIG. 10, a $SiO_2$ layer is then deposited to a thickness of 30 to 200 nm by the plasma CVD process, for example, using tetraethoxysilane, and then patterned by photolithography and dry etching, to form cap layers 28A and 28B functioning as masks for the local interconnecting parts.

Since the pattern of the cap layers must agree with the pattern of the local interconnecting parts, specifically, the cap layers 28A and 28B are formed in correspondence with the shapes of the local interconnecting parts 20A, 20B, 20C and 20C shown in FIG. 6.

Figure 11:
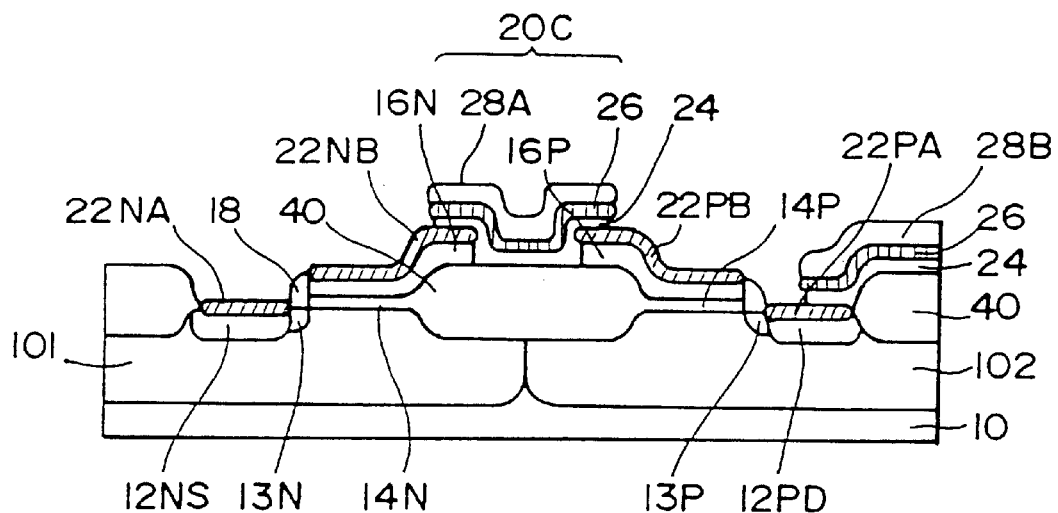

(d) Then, as shown in FIG. 11, heat treatment is carried out in an atmosphere of nitrogen gas for silicidization, for example, at 550 to 800° C. for 5 to 60 seconds. In this process, titanium silicide layers 22NA and 22PA are formed in the interfaces between the titanium layer 210 and the impurity-diffused layers which constitute the source/drain regions 12NS, 12ND, 12PS and 12PD, and the interfaces between the titanium layer 210 and the contact layers 12NC and 12PC, and titanium silicide layers 22NB and 22PB are formed in the interface between the titanium layer 210 and the gate electrodes 16P and 16N. Then, wet etching with an etchant containing ammonia-hydrogen peroxide as a main component is carried out. In this etching, unreacted portions of the titanium layer 210, the titanium nitride layer 240 and the tungsten layer 260 are etched to pattern the local interconnecting parts 20A, 20B, 20C and 20D (FIG. 11 shows only the local interconnecting part 20C). In order to perform this patterning with high precision, only the tungsten layer 260 may be dry-etched (anisotropic etching), and then the titanium nitride layer 240 and the titanium layer 210 may be wet-etched.

In order to stabilize each of the titanium silicide layers 22NA, 22PA, 22NB and 22PB, heat treatment is carried out, for example, at 700 to 1000° C. for 5 to 60 seconds.

(e) Next, as shown in FIG. 12, the interlayer insulating film 30 composed of $SiO_2$ is formed, and the metallic interconnecting part 34 comprising aluminum as a main component is further formed.

Although the above-mentioned manufacturing method uses titanium/titanium nitride/tungsten as metals for forming the local interconnecting part, other metals can be used, as in the first embodiment. For example, a transition metal such as cobalt or nickel may be used as a metal for forming a silicide. A titanium nitride, cobalt nitride or nickel nitride may be used as a nitride for forming the barrier layer. In addition, a high-melting-point metal such as molybdenum or the like, or a silicide thereof may be used as a metal for forming the conductive layer.

In use of a metal silicide for the conductive layer, a preferable layer structure is a structure in which a barrier layer having a lower coefficient of impurity diffusion than the metal silicide which constitutes the conductive layer is provided below the conductive layer because impurities are readily moved by diffusion.

Figure 13:
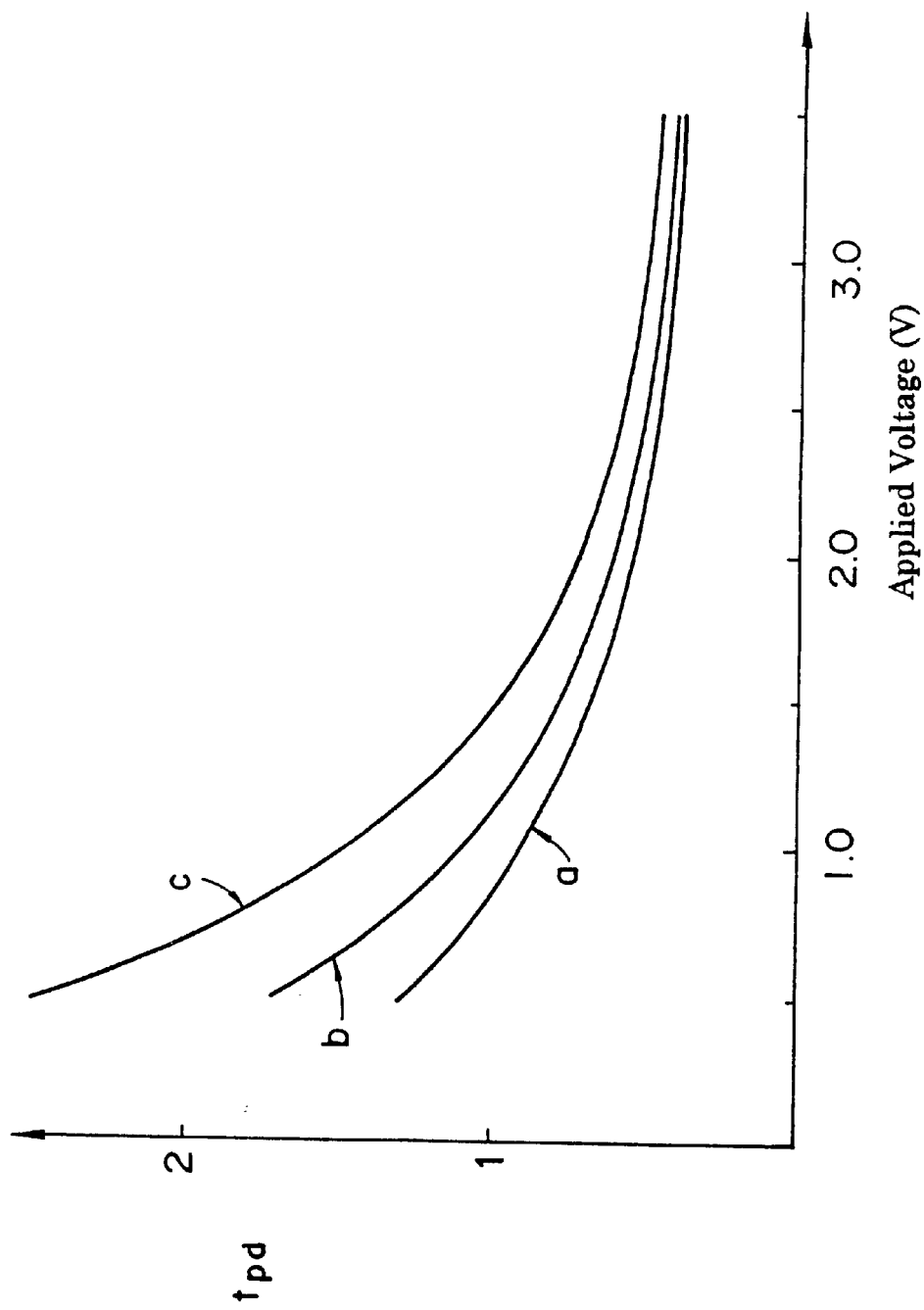
FIG. 13 is a view showing the relations between the applied voltage and the propagation delay time in an example and comparative example of the configuration of a CMOS inverter in accordance with the present invention.

An experimental example carried out on the CMOS inverter in accordance with the present invention will be described below. FIG. 13 shows the relationships between the applied voltage and the propagation delay time ($t_{pd}$) with respect to the CMOS inverter in accordance with the present invention and two comparative examples. The propagation delay time on the ordinate is shown by a relative value. In FIG. 13, a curve shown by character a represents data obtained from the CMOS inverter in accordance with the present invention in which the length of the source is 0.35 $\mu$m. A curve shown by character b represents data in an example (Comparative Example 1) in which the local interconnecting part comprises a titanium nitride layer, and the length of the source (or of the drain) is 0.35 $\mu$m. A curve shown by character c represents an example (Comparative Example 2) of a usual silicide junction without the local interconnecting part in which the lingth of the source (or of the drain) is 1.75 $\mu$m. In these samples, the gate length L (refer to FIG. 5) is 0.25 $\mu$m.

FIG. 13 reveals that the CMOS inverter of the present invention shows an excessively smaller propagation delay time than Comparative Example 1 using titanium nitride for local interconnection, and Comparative Example 2 without local interconnection. Since this tendency is remarkable with an applied voltage of 2 V or less, and more remarkable with an applied voltage of 1.5 V or less, the interconnection structure of the present invention is particularly effective for an applied voltage of 2 V or less, preferably 1.5 V or less.

Figure 14:
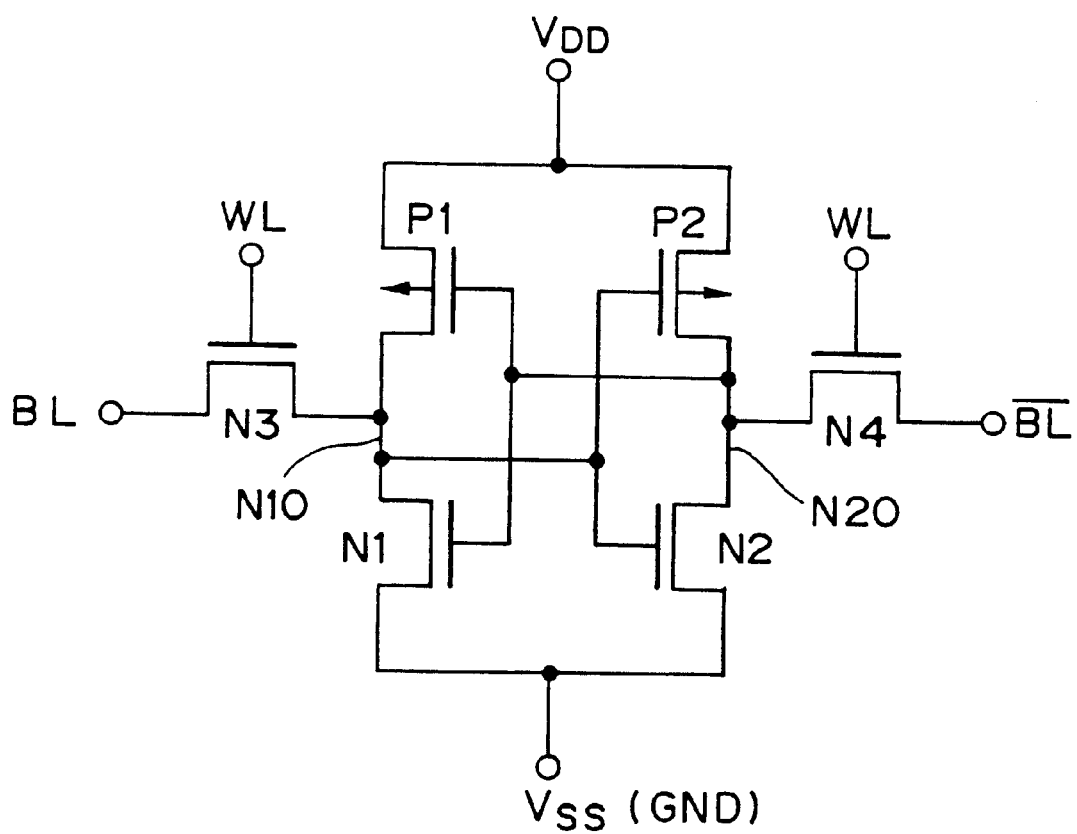
FIG. 14 is a plan view showing the layout of a CMOS SRAM cell in accordance with a third embodiment of the present invention.

In a third embodiment, the present invention is applied to CMOS SRAM. FIG. 14 is a drawing illustrating equivalent circuits of a memory cell of SRAM, and FIG. 15 is a plan view illustrating the layout of the SRAM shown in FIG. 14.

Figure 15:
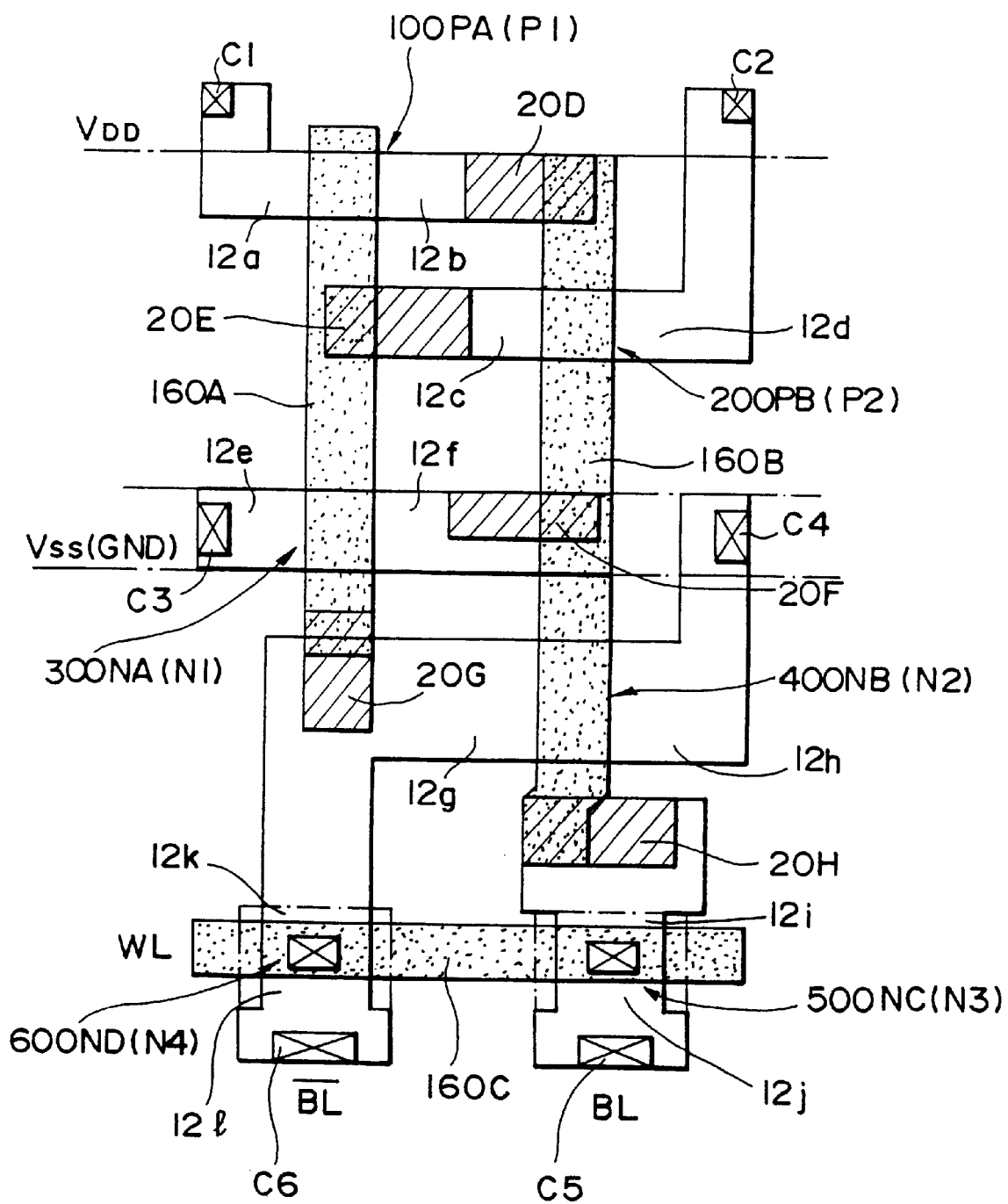
FIG. 15 is a view showing equivalent circuits of the CMOS SRAM cell shown in FIG. 14.

In the SRAM of this embodiment, as shown in FIGS. 14 and 15, one memory cell comprises six transistors. A pair of NMOS transistors N1 and N2 and a pair of PMOS transistors P1 and P2 are interconnected to form a flip flop circuit.

The source regions of the pair of PMOS transistors PI and P2 are connected to a power supply VDD, and the pair of NMOS transistors N1 and N2 are grounded. A pair of NMOS transistors N3 and N4 are connected to anodes N10 and N20, respectively. The source/drain region of each of the NMOS transistors N3 and N4 is connected to a bit line BL, and the gate electrode of each of the NMOS transistors N3 and N4 is connected to a word line WL.

In the SRAM of this embodiment, a PMOS transistor 100PA (P1) and an NMOS transistor 300 NA (N1) have a common gate electrode 160A comprising polysilicon as a component. A PMOS transistor 200PB (P2) and an NMOS transistor 400NB (N2) have a common gate electrode 160B comprising polysilicon as a component. NMOS transistors 500NC (N3) and 600ND (N4) have a common gate electrode 160C comprising polysilicon as a component. The PMOS transistor 100PA has impurity diffused layers 12a and 12b which constitute the source/drain regions and which are formed on both sides of the gate electrode 160A, and is connected to the power supply VDD through a contact part C1. The PMOS transistor 200PB has impurity diffused layers 12c and 12d which constitute the source/drain regions and which are formed on both sides of the gate electrode 160B, and is connected to the power supply VDD through a contact part C2. The NMOS transistor 300NA has impurity diffused layers 12e and 12f which constitute the source/drain regions and which are formed on both sides of the gate electrode 160A, and is grounded through a contact part C3. The NMOS transistor 400NB has impurity diffused layers 12g and 12h which constitute the source/drain regions and which are formed on both sides of the gate electrode 160B, and is grounded through a contact part C4. The access NMOS transistor 500NC has impurity diffused layers 12i and 12j which constitute the source/drain regions and which are formed on both sides of the gate electrode 160C, and is connected to the bit line BL through a contact part C5. Similarly, the NMOS transistor 600ND has impurity diffused layers 12k and 12l which constitute the source/drain regions and which are formed on both sides of the gate electrode 160C, and is connected to the bit line BL through a contact part C6.

In the SRAM constructed as described above, in junction regions between the polysilicon layers which constitute the gate electrodes and the impurity-diffused layers formed in the substrate, the local interconnecting parts 20D, 20E, 20F, 20G and 20H to which the present invention is applied are formed. Since the layer structure of these local interconnecting parts 20D to 20H is the same as the above-described first and second embodiment, detailed description of the layer structure is omitted.

Like in the first and second embodiments, the CMOS SRAM of this embodiment has no possibility of causing counter doping and a decrease in the impurity concentration in the impurity-diffused layers, and thus eliminates change in the threshold value and increase in junction leak. As a result, low-resistance local interconnection is realized. The use of local interconnection can decrease the cell area which is a problem, particularly, of SRAM, and can significantly contribute to a miniaturization of an element.

Although each of the first to third embodiments relates to the case where the local interconnecting part comprises the barrier layer and the conductive layer, the interconnecting part of the local interconnecting part may comprise only a metallic layer. Namely, a metal which can be applied to this interconnection structure has a lower coefficient of impurity diffusion than high-melting-point metal silicides, and a lower resistance than metal nitrides.

Figure 16:
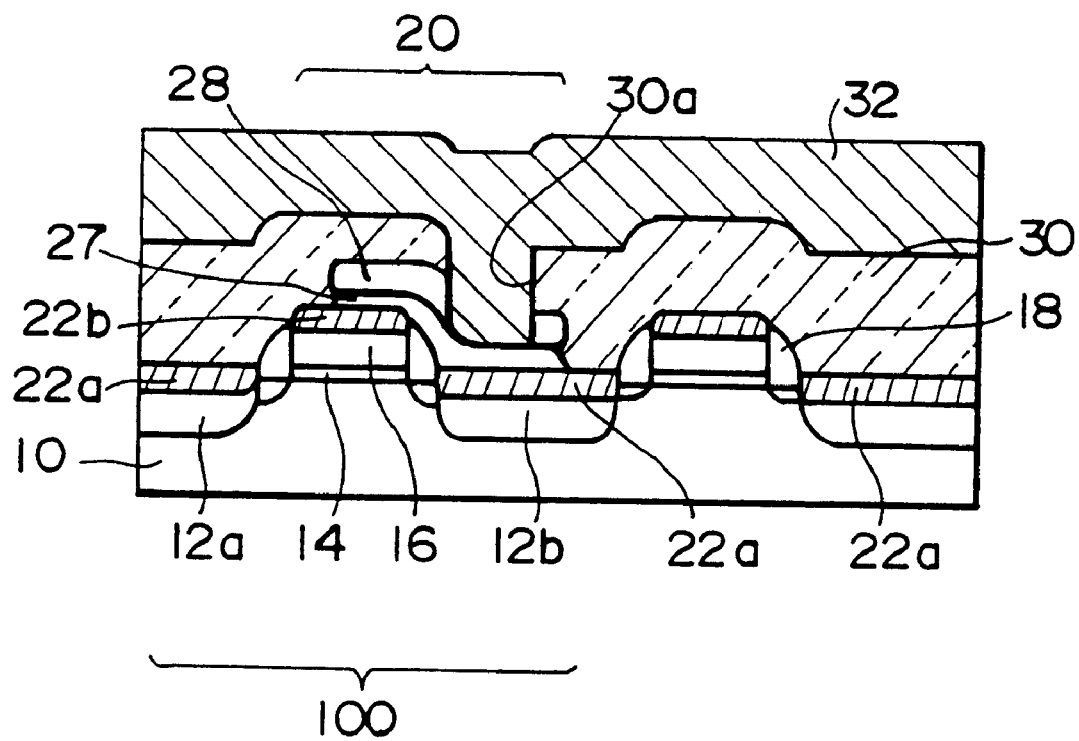
FIG. 16 is a sectional view schematically showing a semiconductor device in accordance with a fourth embodiment of the present invention.
Figure 17:
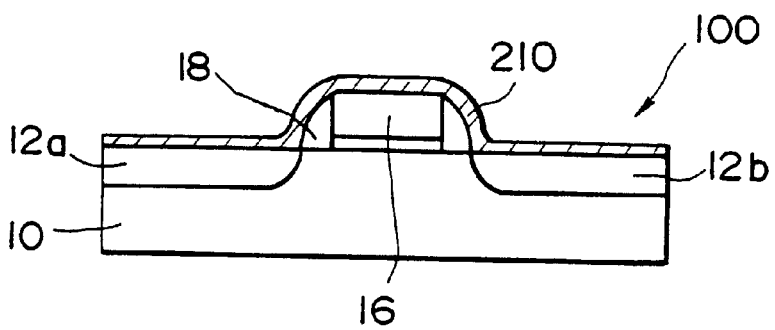
FIGS. 17 to 20 are sectional views showing in turn the steps of an example of a conventional process for manufacturing local interconnection.
Figure 18:
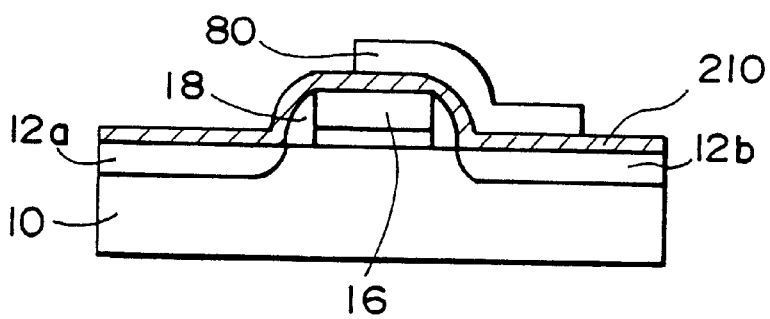
Figure 19:
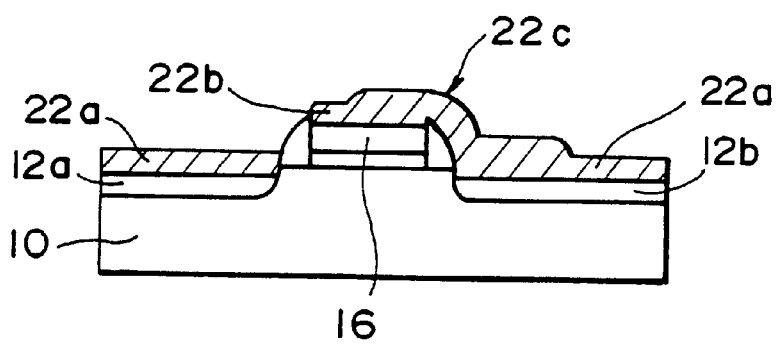
Figure 20:
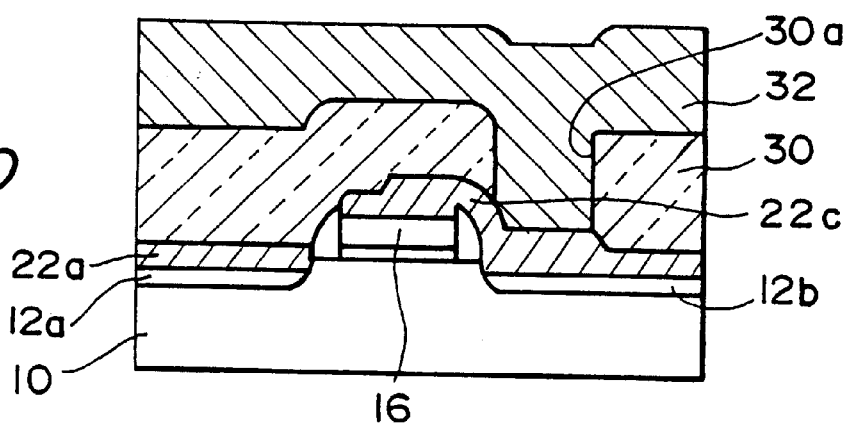

For example, as shown in FIG. 16, the interconnecting part 27 of the local interconnecting part 20 comprises a high-melting-point metal such as tungsten, molybdenum, or the like. In FIG. 16, substantially the same members as those shown in FIG. 1 are denoted by the same reference numerals, and are not described in detail.

In this semiconductor device, since the metal silicide layers 22a and 22b are connected directly to the interconnecting part 27, the metallic layer is preferably formed by sputtering in order to sufficiently connect the both parts. Since the other manufacturing steps are the same as the first embodiment, the other steps are not described.

What is claimed is:

1. A semiconductor device comprising a gate electrode provided above a silicon substrate with an insulating layer therebetween and having an uppermost layer comprising a metal silicide layer; a side-wall insulating layer provided on a side wall of said gate electrode; an impurity-diffused layer serving as a source or a drain region formed within the silicon substrate adjacent said gate electrode, and having a metal silicide layer formed in at least a portion of the surface thereof; a local interconnecting part comprising as a constituent component for electrically connecting said gate electrode and said impurity-diffused layer and formed so as to extend over said gate electrode, the side-wall insulating layer and said impurity-diffused layer, the local interconnecting part being a non-compound metal layer formed in contact with the surface of the metal silicide layer of the gate electrode and the metal silicide layer of the source or drain region; an interlayer insulating layer provided on said local interconnecting part; a contact hole portion formed in said interlayer insulating layer so as to communicate with said local interconnecting part; and a metallic layer provided on said contact hole portion and in the contact hole portion.

2. A semiconductor device according to claim 1, wherein said non-compound metal layer comprises at least one selected from the group consisting of tungsten and molybdenum.

* * * * *